(12) United States Patent
Dick et al.

(10) Patent No.: US 11,768,144 B2
(45) Date of Patent: Sep. 26, 2023

(54) METHODS OF NMR MEASUREMENT OF CRUSHED POROUS MEDIA

(71) Applicant: Green Imaging Technologies Inc., Fredericton (CA)

(72) Inventors: Michael J. Dick, Fredericton (CA); Derrick P. Green, Fredericton (CA); Dragan Veselinovic, Fredericton (CA); Taylor Kenney, Fredericton (CA)

(73) Assignee: Green Imaging Technologies Inc., Fredericton (CA)

( * ) Notice: Subject to any disclaimer, the term of this patent is extended or adjusted under 35 U.S.C. 154(b) by 185 days.

(21) Appl. No.: 17/231,942

(22) Filed: Apr. 15, 2021

(65) Prior Publication Data

US 2021/0325288 A1 Oct. 21, 2021

Related U.S. Application Data

(60) Provisional application No. 63/011,601, filed on Apr. 17, 2020.

(51) Int. Cl.
*G01N 15/08* (2006.01)
*G01N 24/08* (2006.01)

(52) U.S. Cl.
CPC ............ *G01N 15/08* (2013.01); *G01N 24/081* (2013.01); *G01N 2015/0846* (2013.01)

(58) Field of Classification Search
CPC ........ G01N 15/00; G01N 15/08; G01N 24/00; G01N 24/08; G01N 24/081; G01N 2015/0846; G01N 33/24
See application file for complete search history.

(56) References Cited

U.S. PATENT DOCUMENTS

| | | | |
|---|---|---|---|
| 7,092,822 B2 | 8/2006 | Enormand et al. | |
| 9,405,037 B2 | 8/2016 | Al-Muthana et al. | |
| 2006/0272812 A1 | 12/2006 | Yu et al. | |
| 2017/0023540 A1 | 1/2017 | Bona | |
| 2018/0259466 A1* | 9/2018 | Mitchell | G01N 24/081 |
| 2020/0166449 A1* | 5/2020 | Green | G01R 33/30 |

(Continued)

FOREIGN PATENT DOCUMENTS

| | | | |
|---|---|---|---|
| CA | 2824851 A1 * | 2/2014 | ............ G01N 15/08 |
| CN | 105 866 009 A | 8/2016 | |
| CN | 107 831 186 B | 9/2019 | |

(Continued)

OTHER PUBLICATIONS

Coates, G.R., Xiao, L., and Prammer, M.G., NMR Logging. Principles & Applications, Halliburton Energy Services, Houston, 1999.

(Continued)

*Primary Examiner* — Nguyen Q. Ha
(74) *Attorney, Agent, or Firm* — Eugene Derenyi

(57) ABSTRACT

A method of measuring petrophysical information from a crushed porous media including performing one or more NMR measurements on the porous media fully submerged in an NMR visible fluid, performing one or more NMR measurements on the porous media alone following centrifugation, performing one or more NMR measurements on the porous media after rinsing with a NMR invisible fluid, and analyzing the NMR measurements to extract a petrophysical property.

32 Claims, 8 Drawing Sheets

(56) References Cited

U.S. PATENT DOCUMENTS

2020/0363355 A1* 11/2020 Kortunov ............... G01R 33/44

FOREIGN PATENT DOCUMENTS

GB        2542406 A       3/2017
WO    2018195646 A1    11/2018

OTHER PUBLICATIONS

Geo-Spec 2-53 User Manual, Version 1.8, Oxford Instruments.
GIT Systems and LithoMetrix User Manual, Revision 1.9, Green Imaging Technologies.
American Petroleum Institute, Recommended Practices for Core Analysis, API Publications, Washington, D.C., (1998), p. 5-7.
Pittman, E. D., Porosity diagenesis and productive capability of sandstone reservoirs, (1979).
International Search Report—PCT/CA2018/000077, dated Jul. 11, 2018.
Althaus, S. et al, NMR Measurement of Porosity and Density from Drill Cuttings of Unconventional Tight Reserviors, SPWL 60th Annual Logging Symposium, Jun. 17-19, 2019.
Mirotchnik, K. et al, A Novel Method to Determine NMR Petrophysical Parameters from Drill Cuttings, SPWLW 45th Annual Logging Symposium, Jun. 6-9, 2004.
Lenormand, R. et al, Advances in Measuring Porosity and Permeability from Drill Cuttings, SPE Reservoir Characterization and Simulation Conference, Oct. 2007, SPE 111286.
M. J. Dick et al; "Quick and Simple Porosity Measurement at the Well Site", Proceedings of the Internatinal Symposium of the Society of Core Analysts Held in Vienna, Austria, Aug. 28-Sep. 2017; Aug. 28, 2017, XP055756929.
Gallegos D. P. et al; "A NMR technique for the analysis of pore structure: Application to materials with well-defined pore structure"; Journal of Colloid and Interface Science Academic Press, Inc. US, vol. 119, No. 1; Sep. 1, 1987, pp. 127-140, XP024208040.
Jonathan Mitchell et al; "A robust nuclear magnetic resonance workflow for quantitative determination of petrophysical properties from drill cuttings"; Journal of Petroleum Science and Engineering, vol. 174, Nov. 20, 2018, pp. 351-361, XP085585692.
Jorge M. Costa Gomes et al; Reservoir Rock Typing Using NMR & Centrifuge; Jan. 1, 2014; pp. 1-6, XP055517955, Online Retrieved from the Internet: URL:http://www.jgmaas.com/SCA/2014/SCA2014-096.pdf [retrieved on Oct. 23, 2018].
European Search Report for EP application 18790104 dated Dec. 21, 2020.
Extended European Search Report dated Oct. 9, 2021 for EP21168943.5.
Meiboom, S.Gill, D.: "Modified Spin-Echo Method for Measuring Nuclear Relaxation Times", Review of Scientific Instruments, vol. 29, 1958, pp. 688-691.
Dang, S.T.Rolke, M.M.Sondergeld C.H.Rai, C.S.: "Study of drill cuttings porosity for formation evaluation", International Symposium of the Society of Core Analysts, Aug. 28, 2017 (Aug. 28, 2017).
"Avanti J-26 XP High Performance Centrifuge Instruction Manual", May 2008, Beckman Coulter.

* cited by examiner

Hole Size = 0.18 mm x 0.89 mm

Thickness = 0.20 mm

Screen Diameter = 19 mm

40 — PROVIDING AN NMR VISIBLE SAMPLE VESSEL OF A KNOWN VOLUME

↓

50 — PLACING A SAMPLE IN THE VESSEL AND SATURATING THE SAMPLE WITH A FLUID

↓

60 — MEASURING THE VOLUME OF THE SAMPLE AND THE FLUID BY AN NMR SCAN

↓

70 — REMOVING THE FLUID FROM THE VESSEL

↓

80 — SUBJECTING THE SAMPLE IN THE VESSEL TO A CENTRIFUGAL FORCE

↓

90 — ADDING A FLUID TO THE SAMPLE VESSEL AND SUBJECTING THE FLUID AND SAMPLE IN THE VESSEL TO A CENTRIFUGAL FORCE

↓

100 — MEASURING THE VOLUME OF THE SAMPLE BY AN NMR SCAN FOLLOWING THE CENTRIFUGATION OF STEP 90

↓

110 — CALCULATING A GEOPHYSICAL PROPERTY OF THE SAMPLE USING THE KNOWN VOLUME, THE MEASURED VOLUME OF STEP 60 AND THE MEASURED VOLUME OF STEP 100.

FIG. 12

METHODS OF NMR MEASUREMENT OF CRUSHED POROUS MEDIA

CROSS-REFERENCE TO RELATED APPLICATION

This present application claims the benefit of U.S. Provisional Patent Application Ser. No. 63/011,601 filed Apr. 17, 2020.

BACKGROUND

Porosity is the single most important petrophysical property. Knowing the porosity of the rocks(s) in an oil field is vital to the profitable development of the field. The porosity is reflective of the amount of oil present in a field. The earlier porosity is known, the earlier decisions can be made about how to best retrieve the oil from the field.

Rock core analysis and well logging are accurate techniques available for measuring petrophysical parameters (including porosity) in oil and gas reservoirs. However, well logging and coring are not done on all wells due to their high cost. These challenges make utilizing well bore cuttings a potential cost-effective method for porosity measurements as a function of depth in an oil or a gas well. However, modern drilling produces cuttings that are not suitable for most conventional porosity measurements as they are crushed into very small "grain-like" pieces.

Fortunately, nuclear magnetic resonance (NMR) measurements overcome the shortcomings of traditional porosity measurements allowing porosity to be determined efficiently and accurately on drill cuttings. However, NMR measurements of cuttings are not as straightforward as NMR analysis on rock cores. Determining the porosity of cuttings introduces a new set of challenges.

The idea of using NMR measurements for determining the porosity of drill cuttings is not new, with other methods having been previously patented [1] or published [2]. In their patent, Mitchell et al. suggest submerging the cuttings in a bathing liquid which is "immiscible with the fluid in the pores, is non-wetting toward the material, is immiscible with and differs in density from the liquid on the outside of the material, and does not contain a resonant element found in the pore liquid." They suggest that "The bathing liquid displaces fluid from the surface of the porous material but not the liquid in the pores.". Surface water hampers porosity determination because it can be misconstrued in the NMR measurement as water in the pores of the sample leading to an overestimate of porosity. Unfortunately, the method of simply displacing the surface fluid with a bathing fluid is not completely effective, especially when the cuttings have been drilled with polycrystalline diamond compact (PDC) drill bits which crush the rock to very small sizes. The smaller the cuttings, the more surface fluid there is per gram of cuttings making the effect of fluid on the surface even greater.

Dang et al. [2] have suggested a second method for eliminating the NMR signal from fluid on the surface of cuttings and hence deriving the correct porosity. They employ a cutoff to the NMR pore size distribution to distinguish fluid in the pores (below the cutoff) from fluid on the surface (above the cutoff). Unfortunately, the use of cutoffs is prone to error as the position of the cutoff is difficult to determine accurately as signal from fluids in the pores can easily overlap with signal from fluids on the surface of the cuttings.

In WIPO Published Patent Application WO/2018/195646 [3], the present inventors outlined a procedure for determining the porosity of crushed core samples. Crushed core samples were chosen as the initial test case for development of a procedure for porosity determination of cuttings. The porosity of a core plug could be determined via the standard NMR SCAL procedure and then crushed into small pieces. The porosity of these small pieces would then be known and then they could be employed as pseudo-cuttings during the development of the porosity determination procedure.

The principal problem with determining the porosity of cuttings (or crushed core samples) is establishing the bulk volume of the cuttings. The cuttings are small, jagged and unsymmetrical making their bulk volumes impossible to determine via geometrical measurements. In WIPO Published Patent Application WO/2018/195646 [3], the present inventors proposed determining the porosity of cuttings via Equation (1):

$$\text{Porosity} = \frac{\text{Pore volume of cuttings}}{\text{Bulk volume of cuttings}} = \frac{V_{cuttings}}{V_{total} - V_{cuttings+fluid} + V_{cuttings}} \quad (17)$$

where $V_{total}$ is the volume of a vial filled to a predetermined level with the saturating fluid, $V_{cuttings}$ is the pore volume of the crushed core sample and $V_{cuttings+fluid}$ is the volume of liquid and pore volume of crushed core in the vial. FIG. 1 shows a schematic of each of these volumes. It should be noted that the vial is made of an NMR invisible material such as Teflon™ so as to not interfere with the volume measurements. Using Equation (1), the bulk volume of the cuttings is not measured directly, instead it is calculated from three other measurements.

Where crushed core samples are saturated via vacuum saturation, water can remain on the surface of the cuttings. If the cuttings are sufficiently large, this does not pose a problem because the water can be removed by physical means (for example drying with paper towel). However, if the cuttings are too small, it is difficult to remove the water from the surface of the sample without experiencing significant sample loss. Surface water can hamper porosity determination because it can be misconstrued in the NMR measurement as water in the pores of the cuttings leading to an overestimate of $V_{cuttings}$ and hence an overestimate of porosity according to Equation (1).

It would be convenient to have an improved method of estimating the porosity of crushed porous media in general, and well bore cuttings in particular.

BRIEF DESCRIPTION OF THE DRAWINGS

To facilitate further description of the embodiments, the following drawings are provided in which:

FIG. 3c is a top view of the cap of FIG. 3a;

FIG. 3d is a bottom view of the cap of FIG. 3a;

FIG. 12 is a flow chart of a method for determining a geophysical property of a sample according to a method of an aspect of the present disclosure.

DETAILED DESCRIPTION OF EXAMPLES OF EMBODIMENTS

The present invention, in one embodiment, relates to a method of measuring petrophysical information from a crushed porous media including performing one or more NMR measurements on NMR visible fluid alone, performing one or more NMR measurements on the porous media fully submerged in an NMR visible fluid, performing one or more NMR measurements on the porous media alone following centrifugation, performing one or more NMR measurements on the porous media after rinsing with a NMR invisible fluid, and analyzing the NMR measurements to extract a petrophysical property.

Figure 1:
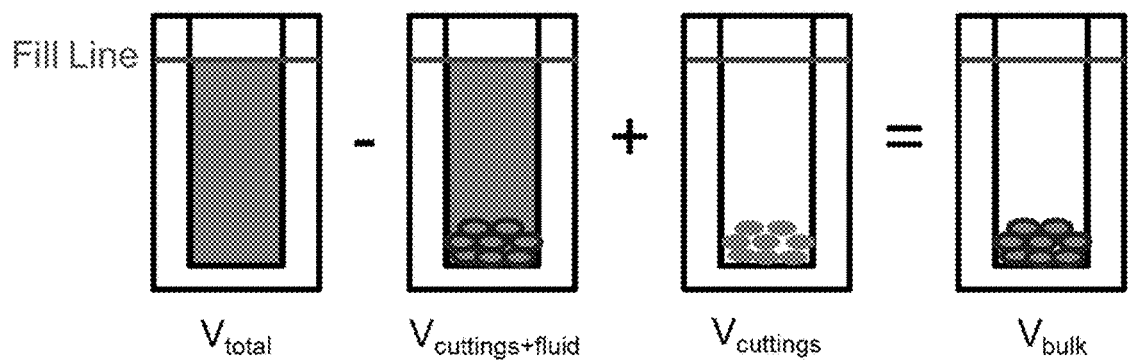
FIG. 1 is a schematic diagram showing the volumes measured in a prior art method to arrive at the porosity of cuttings.
Figure 2:
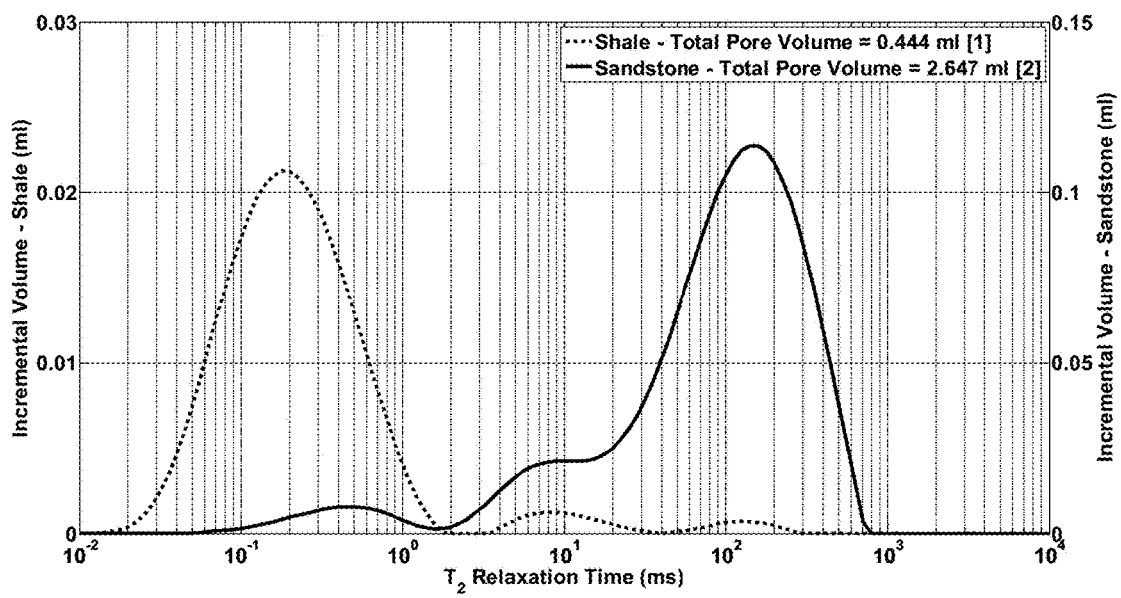
FIG. 2 is a graph of the comparison of the pore size distribution for a shale core plug ([1]) and a sandstone core plug ([2])
Figure 3A:
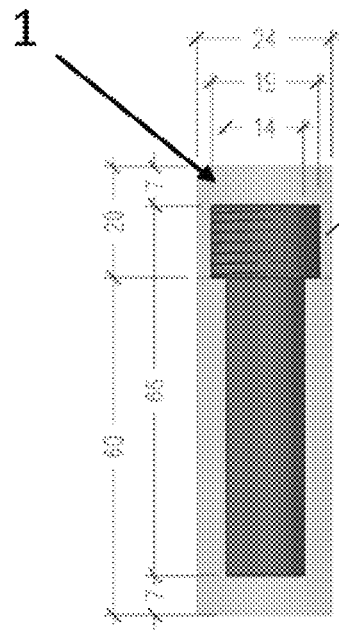
FIG. 3a is a side view of a vial with cap according to an aspect of the present disclosure.
Figure 3B:
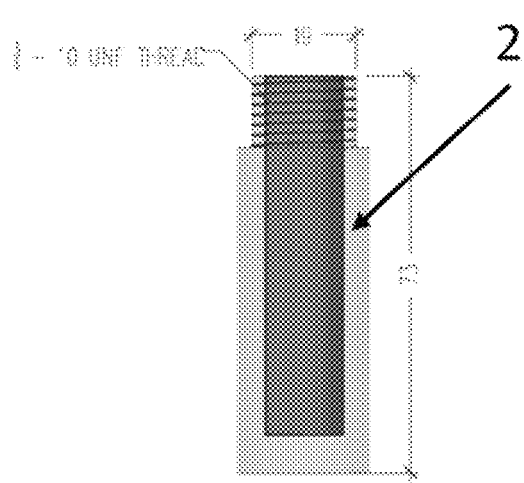
FIG. 3b is a side view of the vial of FIG. 3a without the cap.
Figure 3C:
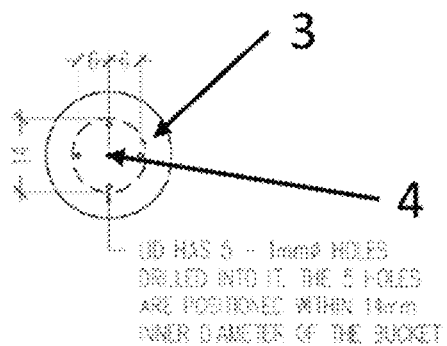
Figure 3D:
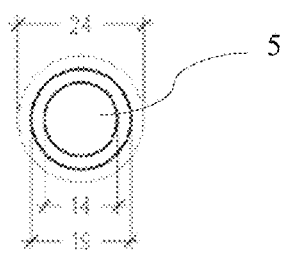

The volumes (pore and bulk fluid) determined via NMR in the following examples were all determined via a Carr-Purcell-Meibloom-Gill (CPMG) Radio Frequency (RF) pulse sequence [4,5]. This sequence enables the transverse relaxation NMR parameter ($T_2$) to be determined. Ignoring diffusion, the relationship between the $T_2$ and the pore size is governed by Equation (2):

$$\frac{1}{T_2} = \frac{1}{T_{2-Bulk}} + \rho \frac{S}{V} \quad (2)$$

where S/V is the surface to volume ratio of the pore, $\rho$ is the relaxivity parameter and $T_2$-bulk is the $T_2$ relaxation time of the fluid. The surface S to volume V ratio is also known as the pore size and, if the other terms are ignored, is directly related to the $T_2$ through the relaxivity parameter, p. Therefore, a plot of volume (retrieved from NMR signal) vs $T_2$ is the pore size distribution (see FIG. 2). FIG. 2 also shows that the surface to volume ratio of a shale sample is much smaller than a sand sandstone sample leading to a shorter $T_2$ relaxation time. The y-axis for each plot in FIG. 2 shows that the sandstone has approximately 5× the pore volume of the shale.

The CPMG $T_2$ NMR acquisition scans for all the samples (bulk volume, core plugs, crushed core and cuttings) tested in this work were recorded on either an Oxford Instruments GeoSpec 2-53 rock core analyzer [6] or an Oxford Instruments MQC+benchtop NMR analyzer [7]. Comparison between the $T_2$ data for the plugs, crushed plugs and cuttings validated the ability of NMR to accurately measure the pore size distributions of drill cuttings. Data acquisition and analysis of the $T_2$ data was achieved via Green Imaging Technologies software [8]. The typical CPMG pulse sequence parameters employed in this testing are summarized in Table 1.

TABLE 1

Standard Scan Parameters Employed For Determination Of Porosity Via NMR

| Pulse Sequence Parameter | $V_{cuttings}$ | $V_{total}$ and $V_{cuttings+fluid}$ |
|---|---|---|
| Recycle Delay (ms) | 750 | 30000 |
| No. Of Scans | To SNR of 100 | 4 |
| Tau (μs) | 100 | 100 |
| $T_2$ Max (ms) | 100 | 4000 |
| Number of Echoes | 2500 | 100000 |
| Typical Scan Length | 22 s | 7 min |

It was important that the same tau (half the separation between RF pulses in CPMG sequence) was employed for all measurements. Different tau values can sometimes alter the volumes retrieved from the CPMG sequence. Employing a consistent tau value meant that all the volumes retrieved can be compared and subtracted accurately.

Prior to initiation of an investigation of determining the porosity of real cuttings, a modification of the procedure as disclosed in WIPO Published Patent Application WO/2018/195646 for crushed core sample was explored. This new effort centered on modifying the procedure so the crushed samples could be centrifuged in air in lieu of Fluorinert [9]. Fluorinert is expensive, so the capability to centrifuge the samples in air in order to remove surface water would make the procedure more cost effective.

Figure 4:
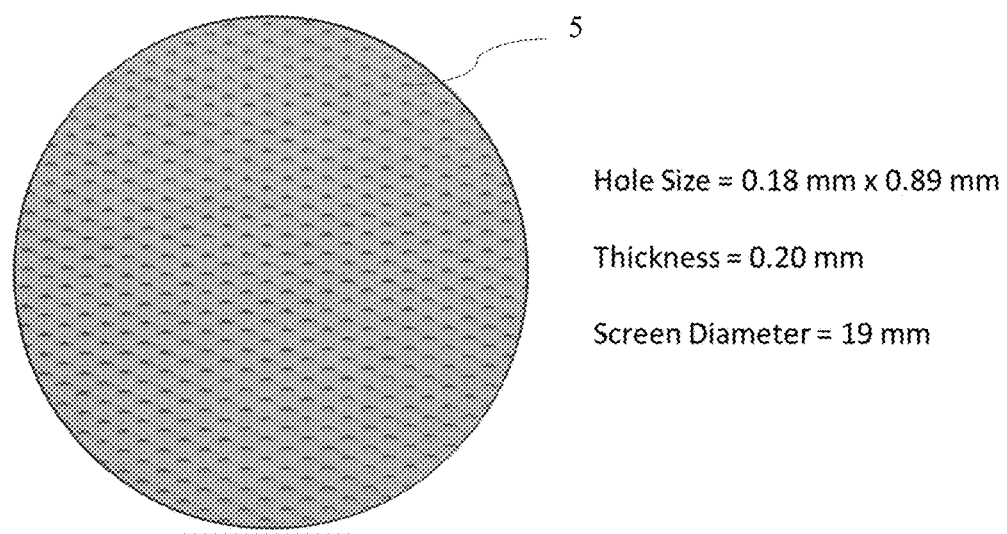
FIG. 4 is an enlarged view of a section of the Teflon™ screen of FIG. 3d.

In order to centrifuge [10,11] the samples in air, a new Teflon™ vial needed to be designed. In this new design, the same vial was to be capable of doing both centrifuging as well as NMR measurements and allow the excess surface water to be eliminated during centrifugation. FIGS. 3a to 3d show a Teflon™ vial indicated generally at 1 according to an embodiment of the present invention. Although dimensions for the vial are included, vials of different dimensions can be used. The vial 1 includes a base 2 and a cap 3. The cap 3 has five 1 mm diameter holes 4 to allow water or other liquid to escape from the vial 1 during centrifuging. As shown in FIG. 4, a fine Teflon™ screen 5 is placed inside the cap 3 to ensure that no sample is lost through the holes 4. An enlarge view of a section of the screen 5 is shown in FIG. 4. The screen 5 in one embodiment has a diameter of 19 mm, a thickness of 0.2 mm with a hole size of 0.18 mm×0.89 mm.

Figure 5:
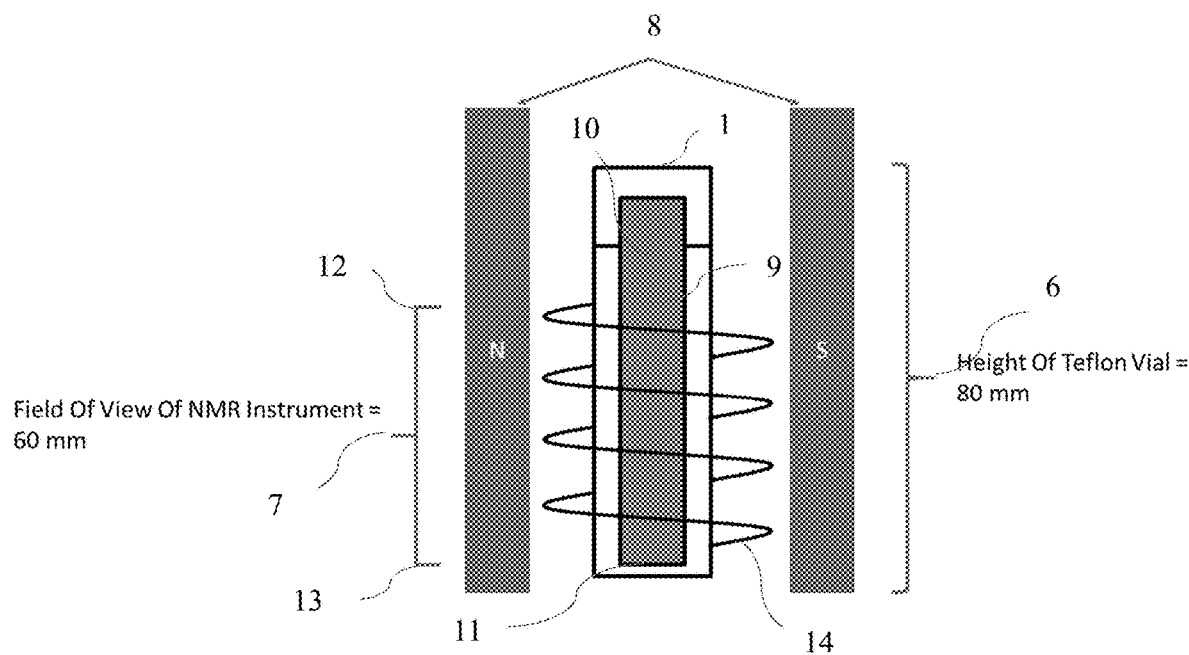
FIG. 5 is a side view of a magnet, an RF coil and a vial according to an aspect of the present disclosure.
Figure 6:
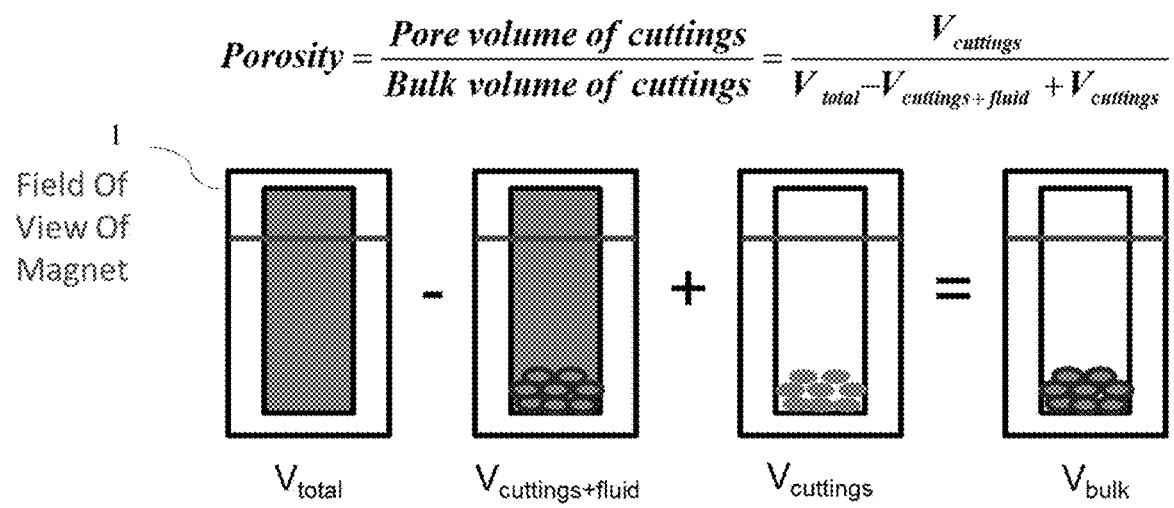
FIG. 6 is a schematic diagram showing the volumes measured in a method according to an aspect of the present disclosure to arrive at the porosity of the cuttings.
Figure 7:
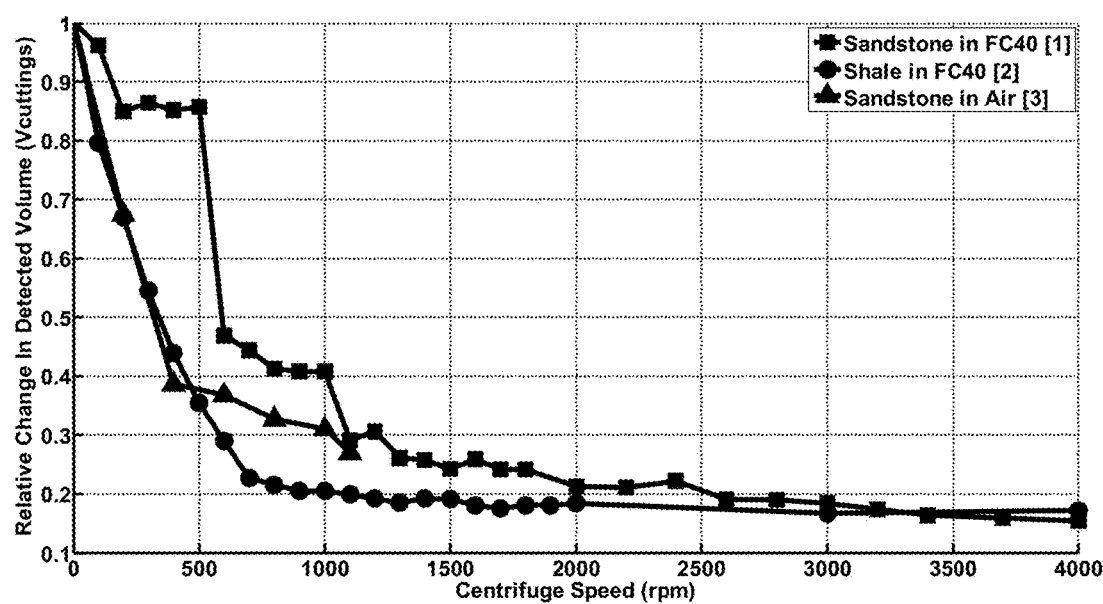
FIG. 7 is a plot of Detected Volume vs. Centrifuge Speed.

Another important modification made in this iteration of the Teflon™ vial 1 was to make the height 6 of the vial 1 higher than the field of view 7 of the magnet 8 (See FIG. 5 where the field of view 7 is defined by the radio frequency (RF) coil 14). As a result, the volumes measured for $V_{total}$ and $V_{cuttings+fluid}$ are determined by the field of view 7 of the magnet 8 rather than a user defined fill line. The upper limit 12 of the field of view 7 of the magnet 8 is used to fix the upper limit 9 of the volume 10 observed, as long as the vial 1 is inserted into magnet 8 to the same depth each time for a given set of measurements. The lower limit of the volume observed is the inside bottom 11 of the vial 1. The bottom 11 corresponds to the lower limit 13 of the field of view 7. FIG. 6 shows a schematic diagram of all the volumes measured using the procedure for determining the porosity of crushed samples in air Wet crushed core samples were placed in the vial 1 and spun in air at increasing speeds. As with the crushed core samples spun in Fluorinert as disclosed in WIPO Published Patent Application WO/2018/195646, the samples spun in air showed two regimes (FIG. 7, trace [3]—data points plotted with triangles). Below 500 RPM, the observed porosity decreased quickly with increasing centrifuge speed corresponding to surface water being removed from the samples. Above 500 RPM, the change in observed porosity slowed corresponding to water being pulled from the pores of the sample. 600 RPM was chosen as the optimal spin speed in air for removing surface water from crushed core samples.

Employing the new Teflon™ vial 1 and the centrifuge speed of 600 RPM for air centrifugation, the following procedure for determination of the porosity of cuttings using air centrifugation was developed:

Fill the vial 1 to the top with brine and measure $V_{total}$. Make sure to insert the vial 1 into and NMR apparatus which includes magnet 8 and coil 14 cap side up.

Figure 8:
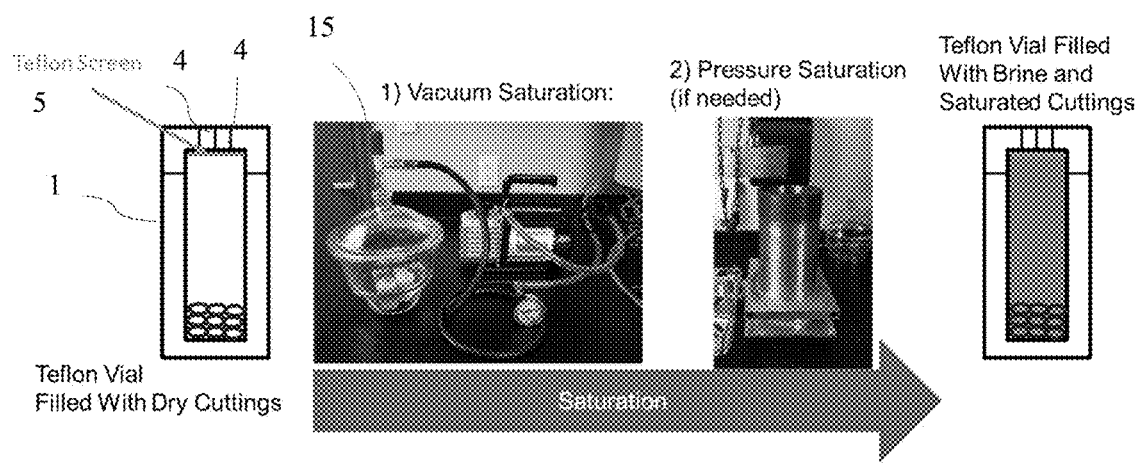
FIG. 8 is a schematic of the saturation procedure for saturating cuttings.

Empty the brine from the vial 1, place a crushed core sample in the vial 1, and place the vial 1 in a saturation vessel 15 (See FIG. 8). Vacuum saturate the sample in the vial 1. Make sure to insert Teflon™ screen 5 into the cap 3 of vial 1 before vacuum saturation.

Remove the vial 1 from the saturation vessel 15 and ensure that the vial 1 is filled to the top with a brine. Insert vial 1 into the magnet 8, cap side up, and measure $V_{cuttings}$+fluid.

Insert the vial 1 into a centrifuge with cap 3 side down or toward center of the centrifuge. Spin the vial 1 with the sample at 600 RPM for 30 mins. Excess brine (including brine on surface of sample) will be ejected from the vial 1.

Remove the vial 1 from the centrifuge and place it in magnet 8, cap side down. Measure $V_{cuttings}$. Determine porosity of the sample using Equation 1.

Using this procedure, the porosity of several crushed core samples was determined to within 6% of the expected value.

Employing this new procedure for porosity determination of crushed samples using centrifugation in air, an attempt was made to determine the porosity of real drill cuttings. The first set of cuttings tested were from a Marcellus shale well cut with a polycrystalline diamond compact (PDC) bit at a depth between 7500 and 7600 feet. In addition to the cuttings, seven core plugs from the same well at the same depth interval were also available for testing (see Table 2 for NMR porosity and depth of each plug).

TABLE 2

Porosity Of Marcellus Core Plug Samples

| Plug Name | Sample Depth (ft) | NMR Porosity (p.u.) |
|---|---|---|
| 1 | 7507 | 6.2 |
| 2 | 7524 | 5.8 |
| 3 | 7524 | 5.3 |
| 4 | 7584 | 8.3 |
| 5 Vertical | 7590 | 7.1 |
| 5 Horizontal I | 7590 | 7.5 |
| 5 Horizontal II | 7590 | 9.7 |

The porosity derived for the cuttings should be equal to the average porosity of these plugs which was 7.1 porosity units (p.u.) with a standard deviation of 1.4 p.u. Unfortunately, when the cuttings were run through steps 1) to 5) of the porosity determination method outlined above with centrifugation in air at 600 RPM, the estimated porosity of the cuttings was much too high. Method steps 1) to 5) above, were repeated with the cuttings, adjusting the centrifuge speed to 3000 RPM. The increase in centrifuge speed was justified because the cuttings were significantly smaller than the crushed core samples studied earlier. The smaller size meant more surface water per gram of sample and that the water would be harder to remove from the surface of the cuttings. Using this increased centrifuge speed, a porosity for the cuttings of approximately 21 p.u. was measured; this is 3 times the expected porosity of the cuttings of 7.1 p.u.

Figure 9A:
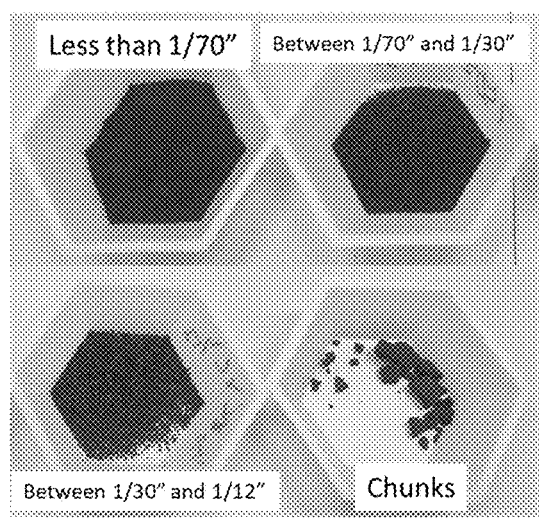
FIG. 9a are photographs of Marcellus crushed core samples.
Figure 9B:
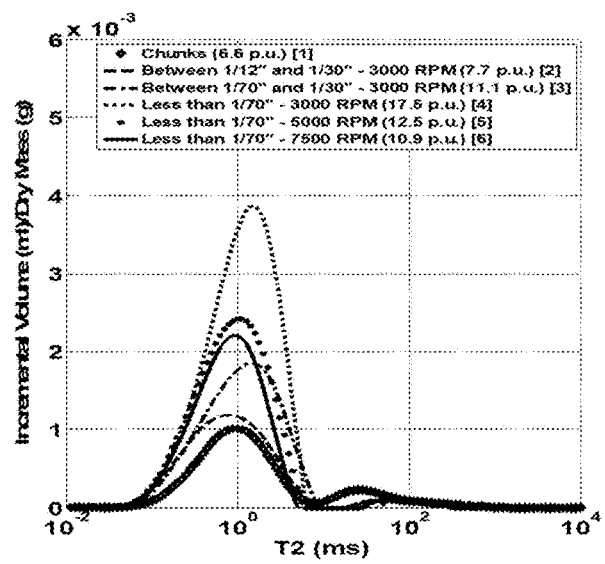
FIG. 9b is a plot of $V_{cuttings}$ pore size distributions derived for samples after centrifugation according to an aspect of the present disclosure.

The first step to investigate this issue was to further explore the effect of sample size on the predicted porosity. Marcellus core plug number 1 was crushed and then sieved it into various sizes including less than 1/70", less than 1/30", between 1/30" and 1/12" and larger chunks (see FIG. 9a for images of sieved samples). Next, each of these sieved samples was run through the porosity determination method of steps 1) to 5) above, with centrifugation in air at 3000 RPM. FIG. 9b shows the $V_{cuttings}$ pore size distribution derived for each sample after centrifugation. Trace [1] is the distribution derived for the larger chunks and its $V_{cuttings}$ yields a porosity of 6.6 p.u. which is very close to the expected porosity of 6.1 p.u. measured for core plug 1. Trace [2] is the pore size distribution derived for the crushed core samples sieved to between 1/30" and 1/12" in size. Using this distribution, a porosity of 7.7 p.u. is determined which is 26% too high as compared to the expected porosity of 6.1 p.u. Traces [3] and [4] are the $V_{cuttings}$ pore size distributions obtained after centrifugation in air at 3000 RPM for the cuttings sieved to between 1/70" and 1/30" and less than 1/70" respectively. Each of these distributions yields a predicted porosity between 2 and 3 times higher than the expected porosity of 6.1 p.u. Finally, Trace [5] and Trace [6] are the pore size distributions measured for the crushed sample sieved to less than 1/70" when the centrifuge speed is increased to 5000 RPM and 7500 RPM respectively. The increased centrifuge speed does help lower the predicted porosity; however, it does not overcome the effect of surface water. For example, the porosity derived from the crushed sample sieved to less than 1/70" is 17.5 p.u. with centrifugation at 3000 RPM while it is 10.9 p.u. with centrifugation at 7500 RPM.

While unsuccessful at producing an accurate porosity, the data derived with crushed core samples sieved to different sizes does show that there is a correlation between sample size and how easy it is to remove the water from the surface of the cuttings. As mentioned above, this is due to the increase of surface water per gram of sample and water being harder to remove from the surface of the smaller samples. To properly determine the porosity of real cuttings, the method of steps 1) to 5) needed to be modified. Centrifugation alone is not enough for removing all the water from the surface of the cuttings and deriving the correct porosity. Many different experimental parameters were altered in an attempt to better remove the surface water from the cuttings, including further varying the centrifuge speed and length of time of centrifugation, sieving the samples to other sizes and changing the material of the Teflon™ screen to ensure that the excess water is drained properly from the vial.

Figure 10:
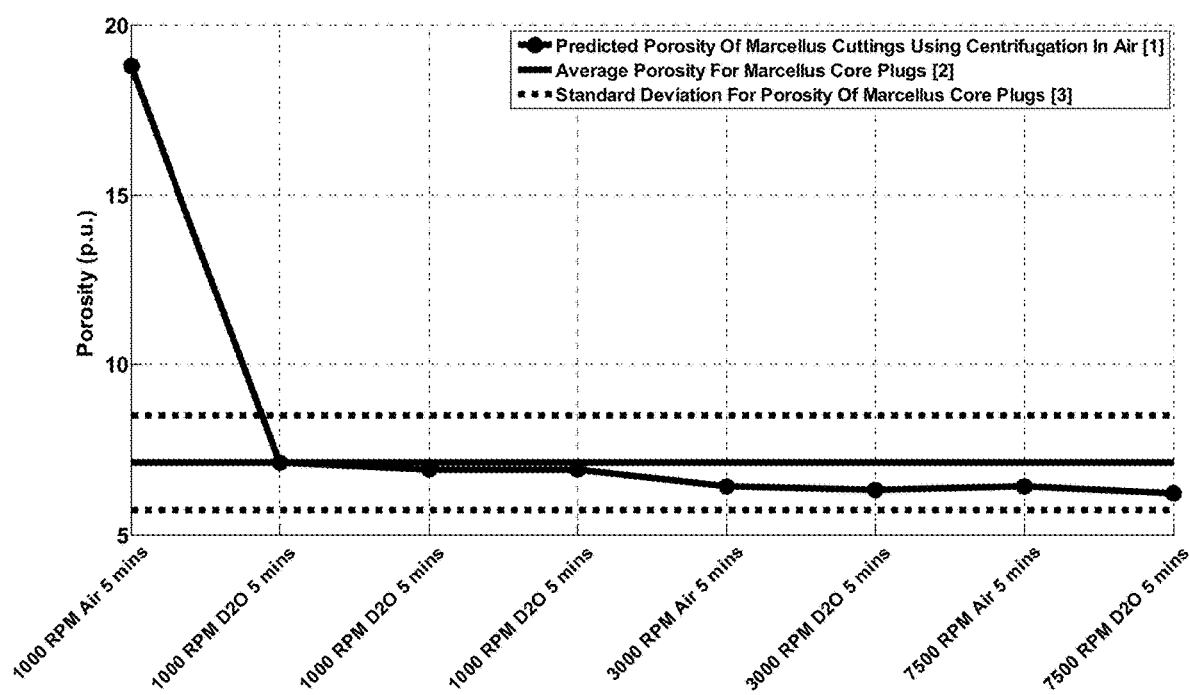
FIG. 10 is a plot of porosity for Marcellus cuttings rinsed with $D_2O$ according to an aspect of the present disclosure.

Eventually, it was determined that rinsing the cuttings with $D_2O$ can lead to a significant reduction in the amount of surface water observed on the cuttings. This is because $D_2O$ is NMR invisible and when a $D_2O$ rinse is employed, the surface water is replaced with $D_2O$ leading to a reduction in observed NMR signal. $D_2O$ rinsing was successfully applied to all the various sieved crushed core samples allowing accurate porosities to be derived for each. Next, D$_2$O rinsing was tested on the Marcellus real drill cuttings. FIG. 10 shows a typical set of results obtained with D$_2$O rinsing. Trace [1](circles) shows the predicted porosity of the cuttings derived after each step described on the x-axis. Trace [2] (solid line) is the average porosity of the seven Marcellus core plugs described in Table 2. Trace [3] (the black dashed lines) is plus and minus one standard deviation of the porosities for the Marcellus core plug samples. The first step (FIG. 10—Trace [1] first black dot) was to spin the cuttings at 1000 RPM in air for five minutes. As expected, this step predicted a porosity (18.8 p.u.) which was three times higher than the expected porosity of 6.1 p.u. The next two black dots show that the cuttings were rinsed twice consecutively with D$_2$O and following these rinses the predicted porosity for the cuttings (6.9 p.u.) was within 5% of the expected value (FIG. 10—Trace [2] (solid black line)). Here a D$_2$O rinse involves injecting 5 ml of D$_2$O into the Teflon™ vial above the cuttings and then spinning the cuttings at 1000 RPM for 5 mins.

FIG. 10 also shows that a series of further D$_2$O rinses and centrifuge steps at higher speeds were also carried out on the Marcellus cuttings. These further rinses and centrifuge steps did not change the predicted porosity of the cuttings significantly. This is very important as it shows that if a sample is rinsed too much or spun too hard, the final predicted porosity won't be affected substantially. For example, the final step shows that even after five D$_2$O rinses and three centrifuge spins at up to 7500 RPM, the final predicted porosity for the cuttings (6.2 p.u.) does not decrease significantly below the expected porosity.

Figure 11:
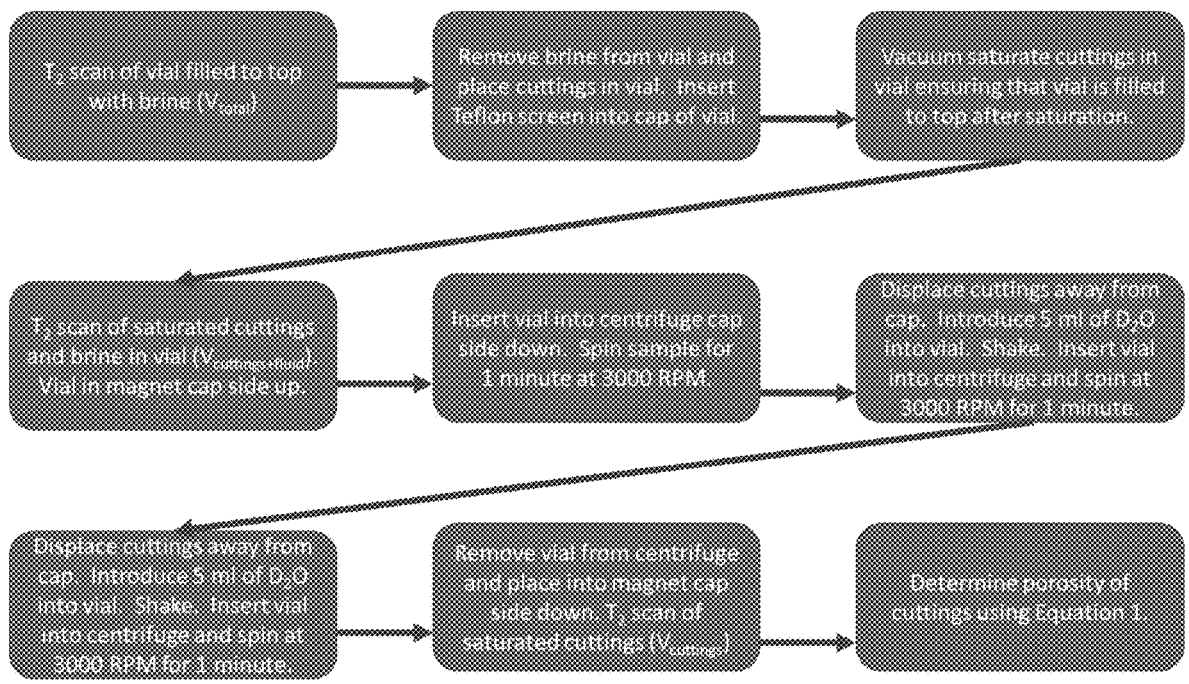
FIG. 11 is a flow chart of a method for determining porosity of drilling cuttings according to an aspect of the present disclosure.

Armed with the knowledge that D$_2$O rinsing is successful, in determining the porosity of cuttings, some time was spent optimizing the method of steps 1) to 5). Specifically, the present inventors looked to minimize the centrifuge speed, the length of time needed for centrifuging and the amount of D$_2$O required. By minimizing these factors, the present method would become faster and more cost effective (D$_2$O is expensive). It should also be noted that other NMR invisible hydrophilic fluids can be employed as the rinsing agent. Eventually, the following method for determining the porosity of real drill cuttings was developed. FIG. 11 shows a flow chart for this optimized procedure.

1) fill a vial 1 to the top with a brine and measure V$_{total}$. Make sure to insert the vial 1 into magnet 8, cap side up;
2) empty the vial 1 of the brine;
3) place a sample (such as a sample of drilling cuttings) in the vial 1;
4) place the vial 1 in a saturation vessel 15 and vacuum saturate the sample in the vial 1. Make sure to insert Teflon™ screen 5 into cap 3 of the vial 1 before vacuum saturation;
5) remove the vial 1 from the saturation vessel 15 and ensure that the vial 1 is filled to the top with the brine;
6) insert the vial 1 into the magnet 8, cap side up, and measure V$_{cuttings+fluid}$;
7) insert the vial 1 into a centrifuge with the cap side down or toward center of the centrifuge and spin the vial 1 with the sample at 3000 RPM for 1 minute. Excess brine will be ejected from the vial 1;
8) remove cuttings that have been accumulated on the screen 5 from centrifuging in step 7) and place the removed cuttings in the vial 1 away from the cap 3. This can be done by, for example, tapping the upright vial 1 on a hard surface and allowing the cuttings to fall to the bottom of the vial 1;
9) introduce 5 ml of D$_2$O (or other NMR invisible hydrophilic liquid) into the vial 1 and mix the D$_2$O;
10) re-insert the vial 1 into the centrifuge cap side down and spin at 3000 RPM for 1 minute to eject D$_2$O from the vial;
11) repeat steps 8 to 10;
12) remove the vial 1 from the centrifuge and place the vial into the magnet 8, cap side down;
13) measure V$_{cuttings}$; and
14) determine porosity of the sample using Equation (1).

With reference to FIG. 12, a method according to another embodiment of the present invention relates to a method for determining a petrophysical property of a crushed porous media sample, where the crushed porous media sample is at least as large as the pore size of the porous media, including the steps of: in step 40 providing an NMR visible sample vessel of a known volume, in step 50, placing a sample in the vessel and saturating the sample with a fluid, in step 60, measuring the volume of the sample and the fluid by an NMR scan, in step 70, removing the fluid from the vessel, in step 80, subjecting the sample in the vessel to a centrifugal force, in step 90, adding a fluid to the sample vessel and subjecting the fluid and sample in the vessel to a centrifugal force, in step 100, measuring the volume of the sample by an nmr scan following the centrifugation of step 90, and in step 110, calculating a geophysical property of the sample using the known volume, the measured volume of step 60 and the measured volume of step 100.

EXAMPLE 1

Using this optimized procedure, the porosity of a second set of cuttings was determined. This set of cuttings were from a Utica shale well and were again drilled with a PDC bit. As with the Marcellus cuttings, the Utica cuttings also had a series of core plugs associated with them taken at known depths which allowed the porosity derived from the cuttings to be compared to expected values. The first three columns of Table 3 show the depth and porosity derived for each Utica core plug via NMR measurement.

TABLE 3

Porosity Of Utica Core Plug And Cutting Samples.

| Plug Name | Sample Depth (ft) | NMR Porosity (p.u.) | Cutting Name | Sample Depth (ft) | NMR Porosity From Cuttings Procedure |
|---|---|---|---|---|---|
| 1 | 12139.9 | 4.1 | 1a | 12130-12140 | 3.9 |
| 2 | 12187.4 | 5.1 | 2a+ | 12190-12200 | 5.1 |
| 3 | 12239.9 | 6.8 | 3a+ | 12230-12260 | 7.2, 6.6 |
| 4 | 12275.5 | 8.1 | 4a + 5a | 12260-12290 | 8.2, 7.8 |
| 5 | 12287.0 | 7.5 | | | |
| 6 | 12320.1 | 6.7 | 6a | 12320-12330 | 3.1, 2.5, 3.1 |

Unlike the Marcellus cuttings, the Utica cuttings were also discriminated by depth. This meant that a one-to-one comparison could be made between the porosity derived from the cuttings and that derived from the core plug recovered at a similar depth. The last three columns of Table 3 show the sample depth and porosity derived for each group of cuttings tested. For the first five cutting group/plug pairs there was excellent agreement between the porosity derived from the plug and that derived from the cuttings. For cuttings group 3a+ and 4a+5a, the porosity of the cuttings was determined more than once and each time there was excellent agreement between the porosity derived from the core plug and that derived from the cuttings. Only for core plug 6 and cuttings sample 6a was the agreement not good. The porosity of the cuttings was determined three times and was consistently determined to be near 3 p.u. The discrepancy with the porosity of the core plug is likely due to an error in labeling the depth of the cuttings or heterogeneity of the porosity in the field.

EXAMPLE 2

The optimized procedure for determining the porosity of cuttings described in the present disclosure is optimized for cuttings which have been cleaned and dried and is intended to be carried out in the lab. In the lab, the cuttings are saturated with brine and it is during this saturation procedure that the cuttings acquire water on their surface. To really be revolutionary, the procedure for determining the porosity of cuttings should be capable of providing porosity as a function of depth in near real time at the well site as a well is being drilled. In this scenario, the cuttings will come out of the well already saturated and covered in cutting fluid instead of brine. The problem with this is that most cutting fluids employed at the well site are oil based rather than water based. This means that the surface of the cuttings is likely covered in oil rather than water after drilling. The $D_2O$ rinsing method described above will not work in removing oil from the surface. $D_2O$ rinsing is effective for removing $H_2O$ because $D_2O$ replaces $H_2O$ on the surface of the cuttings. This replacement occurs because $D_2O$ is miscible in $H_2O$. $D_2O$ is not miscible in oil. However, the optimized procedure for determining the porosity of cuttings can easily be modified to handle cuttings covered in oil-based cutting fluid and is as follows.

1) Fill vial 1 to the top with brine and measure $V_{total}$. Make sure to insert vial 1 into magnet 8 cap side up.
2) Replace brine with cuttings sample. Cuttings are straight from the well and have been screened and/or rinsed with cutting fluid or water.
3) Fill rest of vial 1 with water, insert Teflon™ screen 5 into vial 1 and put cap 3 on vial. Insert vial 1 into magnet 8, cap 3 side up, and measure $V_{cuttings+fluid}$.
4) Insert vial 1 into centrifuge with cap 3 side down or toward center of centrifuge. Spin sample at 3000 RPM for 1 minute. Excess brine will be ejected from the vial 1.
5) Bang bottom of vial 1 on counter allowing cuttings to fall to bottom of vial 1 away from the cap 3. Introduce 5 ml of a solvent which is miscible in both $D_2O$ and oil (such as acetone), shake vial 1, insert vial 1 into centrifuge cap 3 side down and spin at 3000 RPM for 1 minute.
6) Bang bottom of vial 1 on counter allowing cuttings to fall to bottom of vial 1 away from the cap. Introduce 5 ml of $D_2O$, shake vial 1, insert vial 1 into centrifuge cap 3 side down and spin at 3000 RPM for 1 minute.
7) Repeat step 6.
8) Remove vial 1 from centrifuge and place it into magnet cap 3 side down. Measure $V_{cuttings}$. Determine porosity of sample using Equation 1.

This modified procedure was successfully used to determine the porosity of Marcellus cuttings which were saturated in and coated with decane.

REFERENCES

1. UK Patent Application 1516562.4, filed 18 Sep. 2015, GB2542406, Determining properties of porous material by NMR, Mitchell et. al.
2. Dang, S. T., Rolke, M. M., Sondergeld C. H. and Rai, C. S., "Study of drill cuttings porosity for formation evaluation", *International Symposium of the Society of Core Analysts*, August $28^{th}$-Sep. 1, 2017.
3. WIPO Published Patent Application WO2018/195646, Methods of measurement of nuclear magnetic resonance measurement of crushed porous media, Green et. al.
4. Meiboom, S. and Gill, D., "Modified Spin-Echo Method for Measuring Nuclear Relaxation Times", Review of Scientific Instruments (1958), 29, 688-691
5. Coates, G. R., Xiao, L., and Prammer, M. G., NMR *Logging. Principles & Applications*, Halliburton Energy Services, Houston, 1999.
6. Geo-Spec 2-53 User Manual, Version 1.8, Oxford Instruments.
7. MQC+Benchtop NMR Analyzer, Oxford Instruments.
8. GIT Systems and LithoMetrix User Manual, Revision 1.9, Green Imaging Technologies.
9. Safety Data Sheet—FC-40, Version 6.1, Sigma-Aldrich
10. Avanti J-26 XP High Performance Centrifuge Instruction Manual, May 2008, Beckman Coulter.
11. JS-7.5 Swinging Bucket Rotor Instruction Manual, November 2009, Beckman Coulter.

The invention claimed is:
1. A method of extracting a petrophysical property of crushed porous media comprising:
    filling an NMR invisible sample vessel to a given level with an NMR visible fluid, performing an NMR measurement of the NMR visible fluid in the vessel to measure a storage volume of the vessel,
    placing the crushed porous media inside the vessel having the NMR visible fluid such that the crushed porous media is submerged in the NMR visible fluid in the vessel,
    performing one or more NMR measurements on the NMR visible fluid and the crushed porous media submerged in the NMR visible fluid in the vessel,
    removing the NMR visible fluid from the vessel and from outer surfaces of the crushed porpous media,
    rinsing the crushed porous media in the vessel with an NMR invisible fluid, wherein the NMR invisible fluid helps remove any remaining of the NMR visible fluid from the vessel and from the outer surfaces of the crushed porous media,
    performing one or more NMR measurements on the crushed porous media in the vessel with the NMR visible fluid already removed from the vessel and from the outer surfaces of the crushed porous media, and
    analyzing the NMR measurements to extract a petrophysical property of the crushed porous media.
2. The method of claim 1 where the crushed porous media is first sieved to a particle size selected from the group consisting of $\frac{1}{70}$", less than $\frac{1}{30}$", and between $\frac{1}{30}$" and $\frac{1}{12}$".
3. The method of claim 1, where the rinsing with a NMR invisible fluid is done by shaking or agitating the porous media with the fluid.
4. The method of claim 1, where the NMR invisible fluid contains solvents or materials to help with the rinsing.
5. The method of claim 1, further including subjecting the porous media while fully submerged in the NMR visible fluid to a centrifugal force wherein the centrifugal force is of a sufficient magnitude and duration to remove the NMR visible fluid from the surfaces of the crushed porous media but not enough to remove the NMR visible fluid from the pores of the porous media.

6. The method of claim 5, where the porous media is immersed in the NMR invisible fluid being a liquid or gas before the centrifugation.

7. The method of claim 1 where the nuclear magnetic resonance measurement is a Carr-Purcell-Meiboom-Gill (CPMG) echo train.

8. The method of claim 1, where the petrophysical property is porosity.

9. The method of claim 1, where the crushed porous media is first saturated with the NMR visible fluid.

10. The method of claim 1, where the petrophysical property is pore size or pore size distribution.

11. The method of claim 1, wherein the visible NMR fluid is a brine.

12. A method for determining a petrophysical property of a crushed porous media sample, where the crushed porous media sample is at least as large as a pore size of the porous media, comprising:
providing an NMR invisible sample vessel of a known volume,
placing the sample in the sample vessel and saturating the sample with a first fluid,
measuring the volume of the sample and the first fluid by an NMR scan, removing the first fluid from the sample vessel,
subjecting the sample in the sample vessel to a centrifugal force,
adding a second fluid to the sample vessel and subjecting the second fluid and sample to a centrifugal force,
measuring the volume of the first fluid still inside the pores of the sample by an NMR scan following the centrifugation, and
determining the petrophysical property of the sample using the known volume of the sample vessel, the measured volume of the sample and the first fluid and the measured volume of the the first fluid still inside the pores.

13. The method of claim 12, wherein the centrifugal force is of a sufficient magnitude and duration to remove sufficient fluid from surfaces of the sample without removing a significant amount of fluid from the pores.

14. The method of claim 12, wherein the sample comprises drill cuttings of an earth formation removed from a wellbore.

15. The method of claim 12, wherein the first fluid is a liquid or a gas.

16. The method of claim 12, wherein the first fluid is a brine.

17. The method of claim 16, wherein the sample is saturated to about 100% using the first fluid.

18. The method of claim 13, wherein the centrifugal force is determined by a property of the sample.

19. The method of claim 18, wherein the petrophysical property is sample size.

20. The method of claim 13, wherein the duration is determined by a property of the sample.

21. The method of claim 20, wherein the petrophysical property is sample size.

22. The method of claim 12, wherein the nuclear magnetic resonance measurement is a Car-Purcell-Meiboom-Gill (CPMG) echo train.

23. The method of claim 12, wherein the petrophysical property is porosity.

24. The method of claim 12, wherein the petrophysical property is pore size distribution.

25. The method of claim 12, further comprising saturating the sample with more than one fluid where at least one fluid is a nuclear magnetic resonance visible fluid and where the petrophysical property is porosity.

26. The method of claim 12, wherein the step of saturating the sample with the first fluid is performed under a vacuum.

27. The method of claim 12, wherein the sample is surrounded by a NMR inactive liquid or gas during centrifugation.

28. The method of claim 12, wherein the sample is surrounded by air during centrifugation.

29. The method of claim 12, wherein the vessel is a vial comprising an outlet for draining the fluid from the vial.

30. The method of claim 29, wherein the vial is made from a NMR invisible material.

31. The method of claim 30, wherein the material is Teflon™.

32. The method of claim 29, wherein the vial further comprises a removable mesh in the outlet for preventing the sample from being removed from the vial when the fluid is removed.

* * * * *